(12) United States Patent
Matsuzaki

(10) Patent No.: US 7,679,128 B2
(45) Date of Patent: Mar. 16, 2010

(54) SEMICONDUCTOR DEVICE AND METHOD OF FABRICATING THE SAME

(75) Inventor: Kenji Matsuzaki, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/019,290

(22) Filed: Dec. 23, 2004

(65) Prior Publication Data

US 2005/0214994 A1 Sep. 29, 2005

(30) Foreign Application Priority Data

Dec. 24, 2003 (JP) .............................. 2003-427092

(51) Int. Cl.
*H01L 29/788* (2006.01)

(52) U.S. Cl. .................. 257/316; 257/315; 257/317; 257/321; 438/261; 438/264

(58) Field of Classification Search ................ 438/211; 257/314
See application file for complete search history.

(56) References Cited

U.S. PATENT DOCUMENTS

| 4,780,431 A * | 10/1988 | Maggioni et al. ........... 438/588 |
| 5,397,725 A * | 3/1995 | Wolstenholme et al. ...... 438/261 |
| 5,679,970 A * | 10/1997 | Hartmann .................... 257/320 |
| 5,708,285 A * | 1/1998 | Otani et al. .................. 257/315 |
| 5,907,775 A * | 5/1999 | Tseng ......................... 438/261 |
| 6,166,410 A * | 12/2000 | Lin et al. ..................... 257/324 |
| 6,221,717 B1 * | 4/2001 | Cremonesi et al. .......... 438/258 |
| 6,420,754 B2 * | 7/2002 | Takahashi et al. ........... 257/326 |
| 6,630,709 B2 * | 10/2003 | Chang et al. ................ 257/319 |
| 6,635,921 B2 * | 10/2003 | Yi et al. ....................... 257/316 |
| 6,943,074 B2 * | 9/2005 | Kamiya et al. .............. 438/211 |
| 7,061,044 B2 * | 6/2006 | Park et al. .................... 257/319 |
| 7,382,015 B2 * | 6/2008 | Iguchi et al. ................ 257/315 |
| 2003/0209753 A1 * | 11/2003 | Kamiya et al. .............. 257/314 |
| 2006/0063327 A1 * | 3/2006 | Swift et al. .................. 438/257 |
| 2006/0063328 A1 * | 3/2006 | Chindalore et al. ......... 438/257 |

FOREIGN PATENT DOCUMENTS

| JP | 08-078414 | 3/1996 |
| JP | 2001-189300 | 7/2001 |
| JP | 2003-179169 | 6/2003 |

\* cited by examiner

*Primary Examiner*—Steven Loke
*Assistant Examiner*—David Goodwin
(74) *Attorney, Agent, or Firm*—Oblon, Spivak, McClelland, Maier & Neustadt, L.L.P.

(57) ABSTRACT

The present invention relates to a semiconductor device, comprising a semiconductor substrate; a gate insulating film formed on the semiconductor substrate; a plurality of first polycrystalline silicon layers formed on the gate insulating film and including recesses formed therebetween; an inter-gate insulating film formed along the recesses on the first polycrystalline silicon layers; a second polycrystalline silicon layer having an upper flat surface and formed directly on the inter-gate insulating film; an etch-stopping insulating film made from a material different from a material of the inter-gate insulating films and formed on the second polycrystalline silicon layers into a flat plate shape, the etch-stopping insulating film being located immediately above the recesses between the first polycrystalline silicon layers so as to cover the first polycrystalline silicon layers and the recesses between the first polycrystalline silicon layers; and a third polycrystalline silicon layer formed on the etch-stopping insulating film.

7 Claims, 13 Drawing Sheets

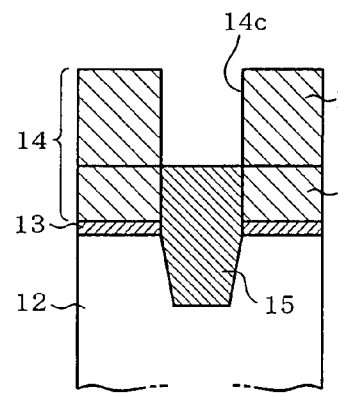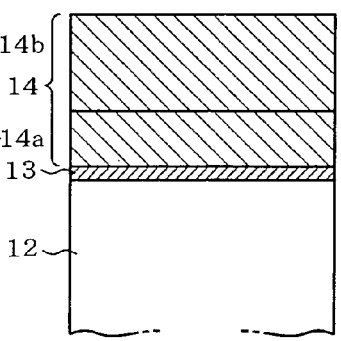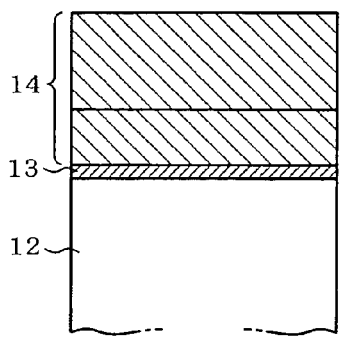
FIG.3A   FIG.3B   FIG.3C
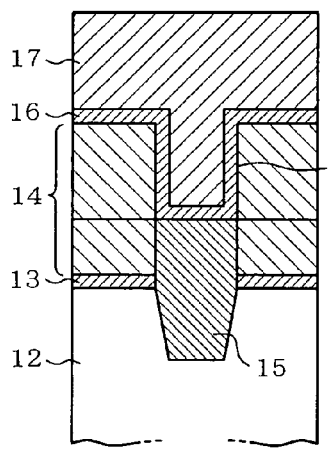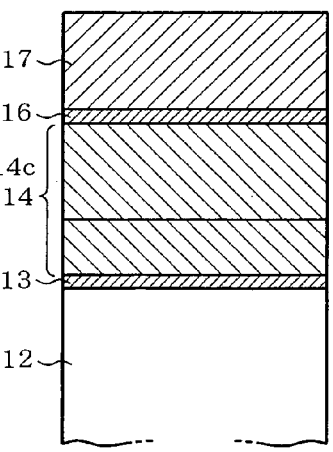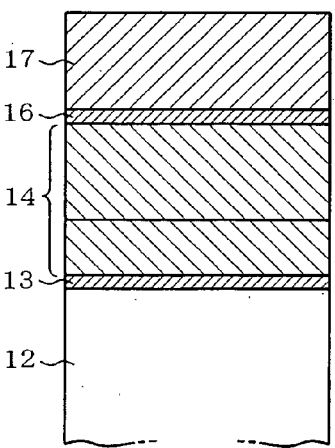
FIG.4A   FIG.4B   FIG.4C

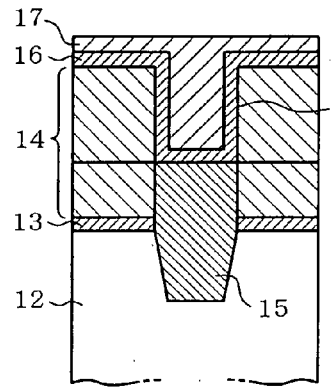
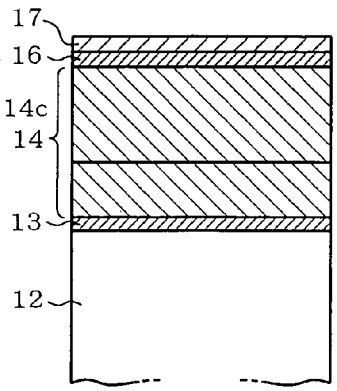
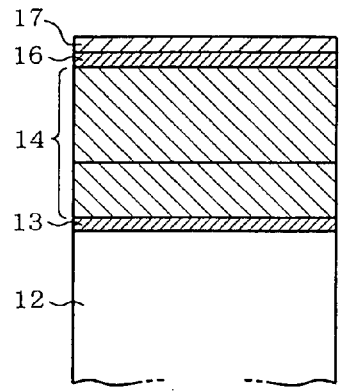
FIG.5A    FIG.5B    FIG.5C
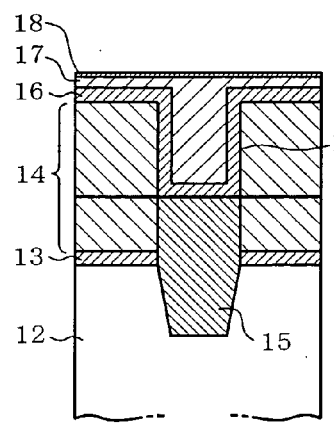
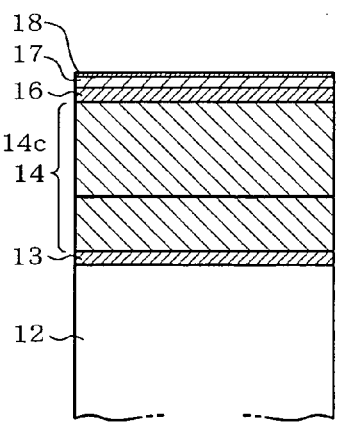
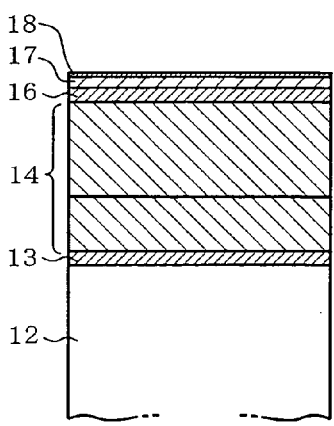
FIG.6A    FIG.6B    FIG.6C

SEMICONDUCTOR DEVICE AND METHOD OF FABRICATING THE SAME

CROSS-REFERENCE TO RELATED APPLICATION

This application claims priority to Japanese patent application No. 2003-427092, the content of which is incorporated herein by reference.

BACKGROUND OF THE INVENTION

1. Field of the Invention

The present invention relates to a semiconductor device which can restrain a microloading effect liable to be produced when a portion of the device to be patterned at a high aspect ratio is etched, and a method of fabricating the same.

2. Description of the Related Art

For example, when a semiconductor substrate is patterned, etching is sometimes carried out simultaneously both for a part where a pattern is dense (hereinafter referred to as "dense pattern part") and for another part where a pattern is sparse (hereinafter referred to as "sparse pattern part"). In this case, since it is hard for a radical in the etching to reach a deep part of dense pattern part of a film to be etched, an etching speed in the dense pattern part becomes lower than an etching speed in the sparse pattern part. As a result, the microloading effect results in level differences among patterns etched under the same conditions.

FIGS. 13A to 14C schematically illustrate sections at individual processes in a method of fabricating a non-volatile memory such as flash memory. FIGS. 13A and 14A are longitudinally sectional views of the major parts. FIGS. 13B and 14B are longitudinally sectional side views showing the dense patterned portion. FIGS. 13C and 14C are longitudinally sectional side views showing the sparse pattern part. In these figures, reference numeral 1 designates a semiconductor substrate, 2 a gate oxide film, 3 and 6 polycrystalline silicon layers respectively, 4 a shallow trench isolation (STI), 5 an oxide-nitride-oxide (ONO) film, 7 a tungsten-silicide (WSi) film or tungsten (W) film, 8 a silicon nitride, and 9 a resist. When each of the layers 6 to 8 is etched nearly to the ONO film 5 with the resist 9 serving as a mask, the polycrystalline silicon layer 6 of the dense pattern part formed on an upper layer of the ONO film 5 is underetched due to the microloading effect, thereby constituting residue (see an underetched remainder 6a shown in FIG. 13B).

The polycrystalline silicon layer 3 formed on the gate oxide film 2 is further formed with a skirt 3a by the microloading effect when the ONO film 5 and the polycrystalline silicon layer 3 are further etched with the resist 9 patterned on the semiconductor substrate 1 or the like serving as the mask until the gate oxide film 2 is exposed. As a result, electrons charged in a floating gate formed by the polycrystalline silicon layer 3 flows through the skirt 3b between memory cells. In the worst case, there is a possibility that the semiconductor device cannot maintain a normal operation such that failure may occur. To overcome the aforementioned drawback, JP-A-2001-189300 discloses a method of fabricating a semiconductor device, for example. In the disclosed method, the dense pattern part is re-etched with only the sparse pattern part being masked, whereby residue due to the microloading effect is eliminated.

In a semiconductor device to be patterned until the aspect ratio of about 5, pattern formation can be carried out while an adverse effect of the microloading effect is restrained as the result of recent improvement in the semiconductor processing. However, in more recent years, the pattern design has been carried out according to a design rule that a semiconductor device is patterned at a further higher aspect ratio (7 or above, for example). Thus, the semiconductor processing needs to be improved itself. Moreover, the dense pattern part and the sparse pattern part need to be formed individually when the aforesaid process is used. Further, in order that the first polycrystalline silicon layer 3 may serve as a floating gate of a flash memory, a recess 3a is sometimes formed in the first polycrystalline silicon layer 3. The ONO film 5 is formed so as to fill and cover the recess 3a. The polycrystalline silicon layer 6 is formed on the ONO film 5. Further, the WSi film or W film 7, the silicon nitride or silicon oxide 8 and the resist 9 are formed and subsequently, an etching process is carried out nearly to the ONO film 5 so that the dense pattern is not underetched. In this case, when the adverse effect of the microloading is considered, the polycrystalline silicon layer 6 is over-etched as far as the inside of the recess 3a formed by the ONO film 5 and the polycrystalline silicon layer 3.

BRIEF SUMMARY OF THE INVENTION

Therefore, an object of the present invention is to provide a semiconductor device in which occurrence of failure due to the microloading can be reduced even when a part to be patterned at a high aspect ratio is etched and the dense pattern part and the sparse pattern part can be prevented from being formed individually, and a method of fabricating the semiconductor device.

Another object of the invention is to provide a semiconductor device in which a polycrystalline silicon layer is buried in a recess and the recess can be prevented from being over-etched when a part to be patterned at a high aspect ratio is etched, and a method of fabricating the semiconductor device.

The present invention provides a semiconductor device comprising a semiconductor substrate, a gate insulating film formed on the semiconductor substrate, a first polycrystalline layer formed on the insulating film, an inter-poly insulating film formed on the first polycrystalline layer, a second polycrystalline layer formed on the inter-poly insulating film, an etch-stopping insulating fun formed on the second polycrystalline layer including a silicon oxide film, and a third polycrystalline layer formed on the etch-stopping insulating film.

BRIEF DESCRIPTION OF THE DRAWINGS

Other objects, features and advantages of the present invention will become clear upon reviewing the following description of the embodiment with reference to the accompanying drawings, in which:

FIG. 3A is a sectional view of the major part of the semiconductor device as viewed from the front side (phase 1);

FIGS. 3B and 3C are longitudinal side sections of the dense and sparse pattern parts, showing the fabrication steps, respectively (phase 1);

FIG. 4A is a sectional view of the major part of the semiconductor device as viewed from the front side (phase 2);

FIGS. 4B and 4C are longitudinal side sections of the dense and sparse pattern parts, showing the fabrication steps, respectively (phase 2);

FIG. 5A is a sectional view of the major part of the semiconductor device as viewed from the front side (phase 3);

FIGS. 5B and 5C are longitudinal side sections of the dense and sparse pattern parts, showing the fabrication steps, respectively (phase 3);

FIG. 6A is a sectional view of the major part of the semiconductor device as viewed from the front side (phase 4);

FIGS. 6B and 6C are longitudinal side sections of the dense and sparse pattern parts, showing the fabrication steps, respectively (phase 4);

DETAILED DESCRIPTION OF THE INVENTION

Figure 1A:
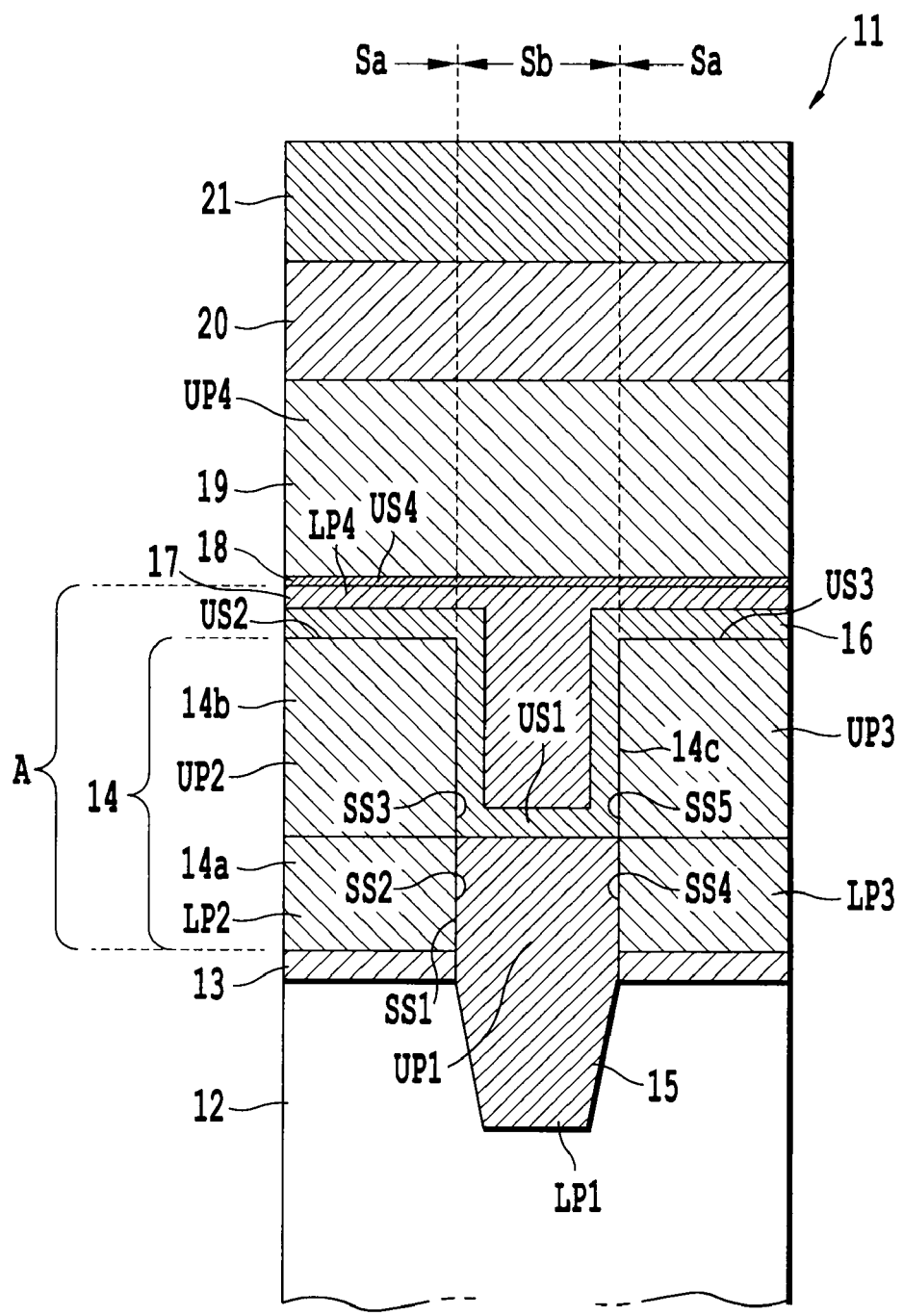
FIG. 1A is a sectional view of a major part of a semiconductor device of one embodiment of the present invention as viewed from the front side.
Figure 1B:
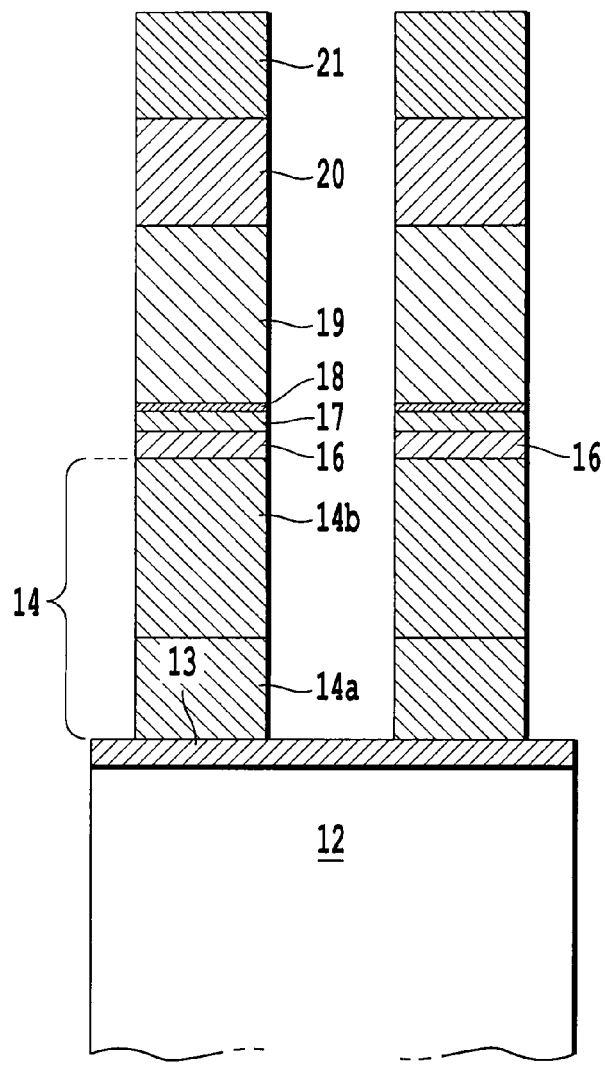
FIG. 1B is a longitudinal side section of a dense pattern part of the semiconductor device.
Figure 1C:
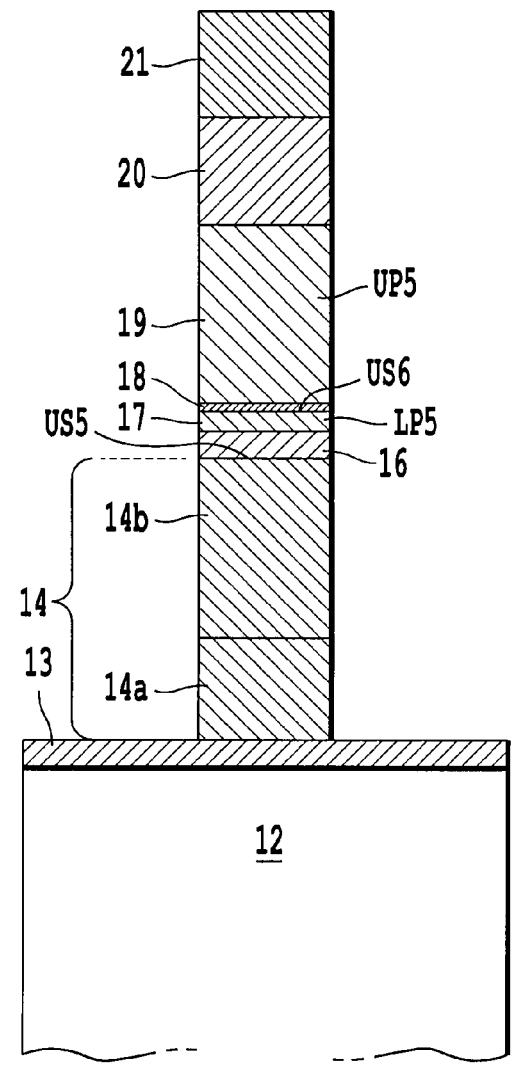
FIG. 1C is a longitudinal side section of a sparse pattern part of the semiconductor device.
Figure 2A:
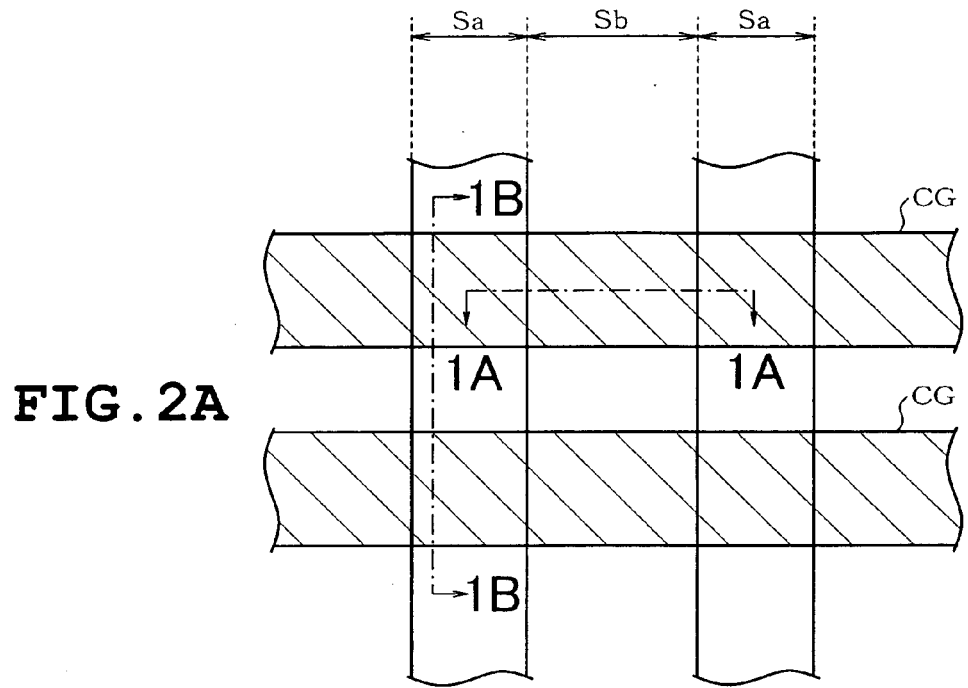
FIGS. 2A and 2B are plan views of the dense and sparse pattern parts, showing fabrication steps of the semiconductor device respectively.
Figure 2B:
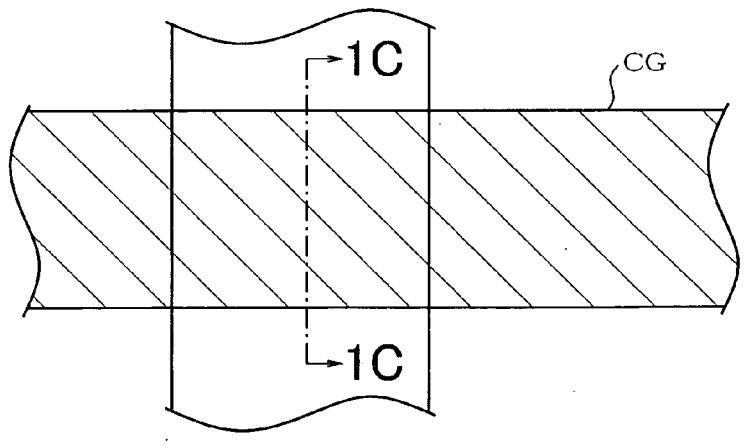

One embodiment of the present invention will be described with reference to FIGS. 1A to 12C. In the embodiment, the invention is applied to a gate electrode structure of a non-volatile memory. The non-volatile memory is divided into a peripheral circuit region and a memory cell region. FIG. 2A is a typical plan view showing a memory cell region (corresponding to a dense pattern part). FIG. 2B is a typical plan view showing a part of a peripheral circuit region (corresponding to a sparse pattern part). Reference symbol "CG" in FIGS. 2A and 2B designates a gate electrode forming region. FIGS. 1A to 1C are sectional views showing a floating gate structure between memory cells and an element isolation structure of control gate structure.

FIG. 1A is a sectional view taken along line 1A-1A in FIG. 2A, showing a gate electrode structure in the memory cell region shown in FIG. 2A. FIG. 1B is a sectional view taken along line 1B-1B in FIG. 2A and FIG. 1C is a sectional view taken along line 1C-1C in FIG. 2B. In FIGS. 1A and 1C various parts, e.g., portions and surfaces of the gate electrode recited, are designated by reference symbols such as "UP1," "US1" to further illustrate a structure of the gate electrode of the invention. In the following description, the portions and surfaces will be designated by these reference symbols.

The non-volatile memory 11 has the following structure in the element region Sa. In the element region Sa as shown in FIG. 1A, a semiconductor substrate 12 has a gate oxide film 13 formed thereon and serving as a gate insulating film. A first inter-gate polycrystalline silicon conductive layer 14 is formed on the second and third upper surfaces US2 and US3 of the gate oxide film 13. The first polycrystalline silicon layer 14 has functions of first and second floating gate electrodes and a lower electrode of a memory cell in the non-volatile memory 11. The first floating gate electrode has a second lower portion LP2 (14a) and a second upper portion UP2 (14b). The second lower portion LP2 has a second side surface SS2, and the second upper portion UP2 has a second upper surface US2 and a third side surface SS3. The second floating gate electrode has a third lower portion LP3 and a third upper portion UP3. The third lower portion LP3 has a fourth side surface SS4, and the third upper portion UP3 has a third upper surface US3 and a fifth side surface SS5. The lower electrode has a fifth upper surface US5. An oxide-nitride-oxide (ONO) film 16 serving as a first inter-gate insulating film is formed on the second and third upper surfaces US2 and US3 of the first polycrystalline silicon layer 14.

A second polycrystalline silicon conductive layer 17 is formed on the ONO film 16. The second polycrystalline silicon conductive layer 17 corresponds to a lower portion LP4 of a control electrode and has a fourth upper surface US4. The second polycrystalline silicon conductive layer 17 further corresponds to a fifth lower portion LP5 of an upper electrode and has a sixth upper surface US6. A silicon oxide film 18 serving as a first insulating film is formed on the first polycrystalline silicon layer 14. A silicon oxide film 18 (a second insulating film) serving as an etch-stop insulating film is formed on the second polycrystalline silicon layer 17. A third polycrystalline silicon conductive layer 19 is formed on the silicon oxide film 18. The third polycrystalline silicon conductive layer 19 corresponds to a fourth upper surface UP4 of the control electrode and further to a fifth upper portion UP5 of an upper electrode. A tungsten-silicide (WSi) film 20 is formed on the third polycrystalline silicon layer 19. The third polycrystalline silicon layer 17 and the WSi film 20 functions as a control gate electrode of the non-volatile memory 11. A silicon nitride film 21 is formed on the WSi film 20.

Further, in the element isolation region Sb as shown in FIG. 1A, the semiconductor substrate 12 is formed with a shallow trench isolation (STI) 15. The STI 15 has a first lower portion LP1 and a first upper portion UP1. The first upper portion UP1 has a first side surface SS1 and a first upper surface US1. The ONO film 16 is formed on the first upper surface US1 of the STI 15. The second polycrystalline silicon layer 17 is formed on the ONO film 16. The silicon oxide film 18 serving as a first etch-stop insulating film is formed on the second polycrystalline silicon layer 17. The third polycrystalline silicon layer 19 is formed on the silicon oxide film 18. The WSi film 20 is formed on the third polycrystalline silicon layer 19. The silicon nitride film 21 is formed on the WSi film 20. A multilayer structure section A is constituted by the first and second polycrystalline silicon layers 14 and 17 and ONO film 16.

The ONO film 16 is formed on the STI 15 in the element isolation region Sb. The ONO film 16 functions as an isolation film of a memory cell of floating gate electrode in the non-volatile memory and electrically isolates the first polycrystalline silicon layer 14 from the first polycrystalline silicon layer 14 adjacent to the former. More specifically, a recess 14c is formed between the first polycrystalline silicon layers 14 adjacent to each other or in a portion encompassed by a third side surface SS3, a fifth side surface SS5 and the first upper surface US1. The ONO film 16 is formed along the recess 14c so as to have a uniform thickness. Thus, the ONO film 16 functions as the isolation film of the floating gate electrode in the non-volatile memory.

The second polycrystalline silicon layer 17 is formed on the ONO film 16 formed in the recess 14c so as to be buried in the recess 14c or so as to fill and cover the recess 14c. The second polycrystalline silicon layer 17 is formed so as to cover the ONO film 16 so that the characteristics of the ONO film 16 as an insulating film in the element region Sa and element isolation region Sb are prevented from being adversely affected by the second polycrystalline silicon layer 17.

Further, the second polycrystalline silicon layer 17 is planarized on the ONO film 16 so that an upper surface (the fourth upper surface US4) of the second polycrystalline silicon layer 17 is substantially co-planar in the element region Sa and the element isolation region Sb. On the second polycrystalline silicon layer 17 are sequentially stacked the silicon oxide film 18, third polycrystalline silicon layer 19, WSi film 20 and silicon nitride film 21 in each of the element region Sa and element isolation region Sb.

FIGS. 3A to 12C typically illustrate an example of a method of fabricating the gate electrode in the non-volatile memory. Figures suffixed with the character "A", that is, FIGS. 3A to 12A show fabrication steps of sections corresponding to FIG. 1A. Figures suffixed with the character "B", that is, FIGS. 3B to 12B are longitudinal side sections showing fabrication steps of the dense pattern part corresponding to FIG. 1B. Figures suffixed with a character "C", that is, FIGS. 3C to 12C are longitudinal side sections showing fabrication steps of the sparse pattern part corresponding to FIG. 1C.

The non-volatile memory is fabricated as follows. Firstly, the description will deal with initial fabrication steps which do not constitute the characteristics of the embodiment. As shown in FIGS. 3A to 3C, the gate oxide film 13 serving as a gate insulating film is formed on the surface of the semiconductor substrate 12 (a first step). A lower layer 14a of the first polycrystalline silicon layer 14 is formed on the gate oxide film 13. Further, the STI 15 to isolate the floating gate electrode of each memory cell is formed and thereafter, an upper layer 14b of the first polycrystalline silicon layer 14 is formed on the lower layer 14a. Subsequently, the recess 14c is formed between the first polycrystalline silicon layers 14 constituting the floating gate electrode of each memory cell (a second step).

As shown in FIGS. 4A to 4C, the ONO film 16 serving as the first insulating film is formed on the first polycrystalline silicon layer 14 and STI 15 along the recess 14c so as to have a uniform thickness (a third step). As a result, the first polycrystalline silicon layers 14 are isolated by the gate oxide film 13, STI 15 and ONO film 16. Subsequently, the second polycrystalline silicon layer 17 is stacked on the ONO film 16 so as to fill and cover the ONO film 16.

Further, as shown in FIGS. 5A to 5C, the surface of the second polycrystalline silicon layers 17 is etched back by the chemical dry etching (CDE) or reactive ion etching (RIE) process and then planarized (a fourth step). An amount of the surface of the layer 17 to be planarized is optional. In this case, an etching condition may be adjusted so that etching is stopped just before the surface of the ONO film 16 is exposed and so that the ONO film 16 is slightly covered. Alternatively, the etch back may be carried out until the surface of the ONO film 16 is exposed.

Subsequently, as shown in FIGS. 6A to 6C, the second polycrystalline silicon layer 17 is planarized and thereafter, the surface of the layer 17 is thermally treated so that the silicon oxide film 18 is formed (a fifth step). In case that the surface of the ONO film 16 is exposed by the etch back of the second polycrystalline silicon layer 17, an amount of oxidation for the silicon oxide film 18 may be adjusted in such a degree that the function of the ONO film 16 is not depressed or so that the film thickness of the ONO film 16 is not changed to a large degree.

Figure 7A:
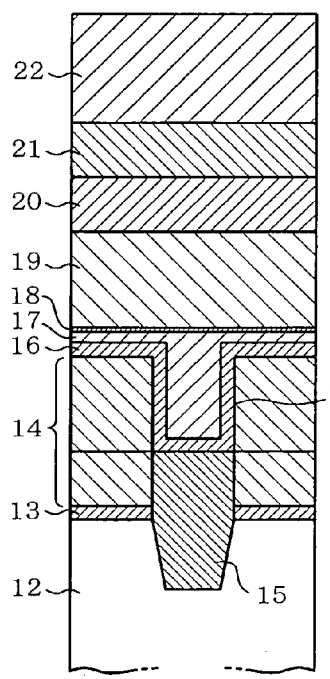
FIG. 7A is a sectional view of the major part of the semiconductor device as viewed from the front side (phase 5)
Figure 7B:
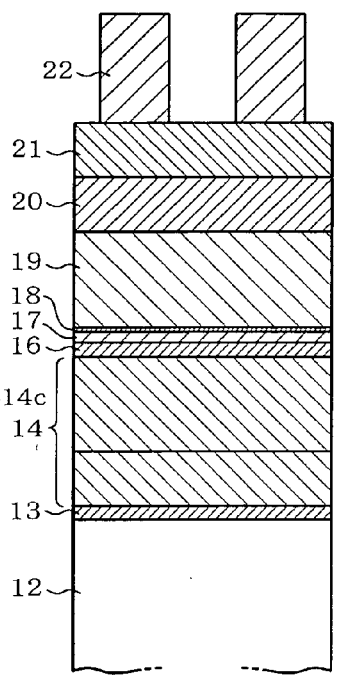
FIGS. 7B and 7C are longitudinal side sections of the dense and sparse pattern parts, showing the fabrication steps, respectively (phase 5)
Figure 7C:
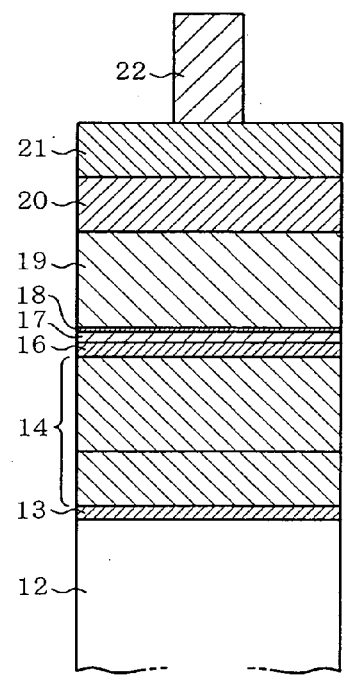

Subsequently, as shown in FIGS. 7A to 7C, a polycrystalline silicon layer 19 made from the same material as the second polycrystalline silicon layer 17 is formed on the silicon oxide film 18 (a sixth step). The WSi film 20 is formed on the polycrystalline silicon layer 19. The silicon nitride film 21 is formed as an upper layer of the WSi film 20. A tungsten (W) film may be formed instead of the WSi film 20, and a silicon oxide may be formed instead of the silicon nitride film 21. Subsequently, a resist 22 is patterned on the silicon nitride film 21 and thereafter, the silicon nitride film 21 is etched with the patterned resist 22 serving as a mask (not shown).

Figure 8A:
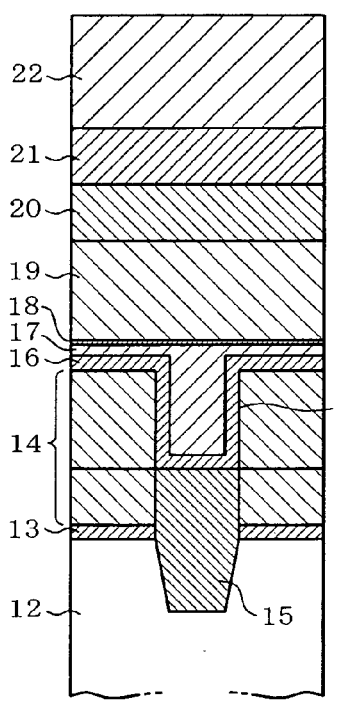
FIG. 8A is a sectional view of the major part of the semiconductor device as viewed from the front side (phase 6)
Figure 8B:
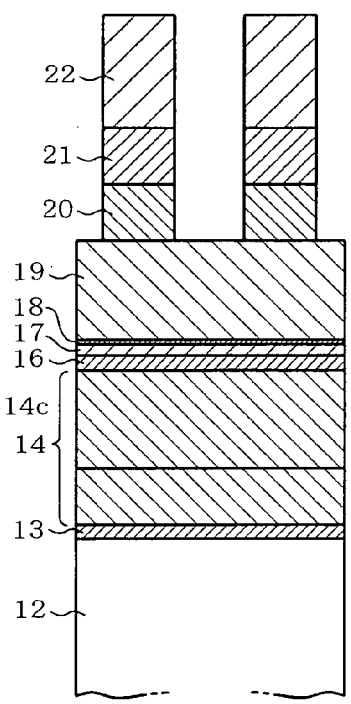
FIGS. 8B and 8C are longitudinal side sections of the dense and sparse pattern parts, showing the fabrication steps, respectively (phase 6)
Figure 8C:
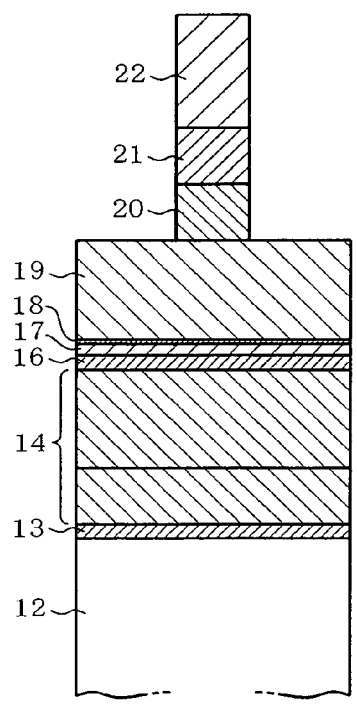
Figure 9A:
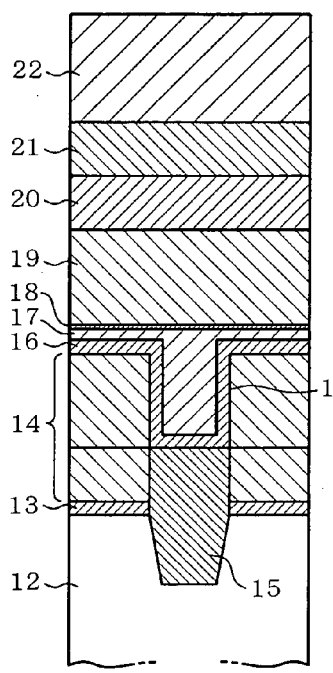
FIG. 9A is a sectional view of the major part of the semiconductor device as viewed from the front side (phase 7)
Figure 9B:
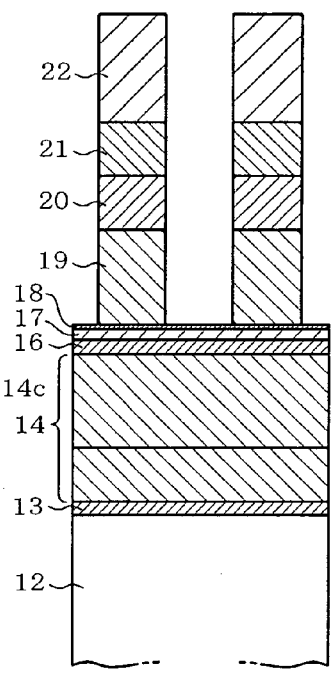
FIGS. 9B and 9C are longitudinal side sections of the dense and sparse pattern parts, showing the fabrication steps, respectively (phase 7)
Figure 9C:
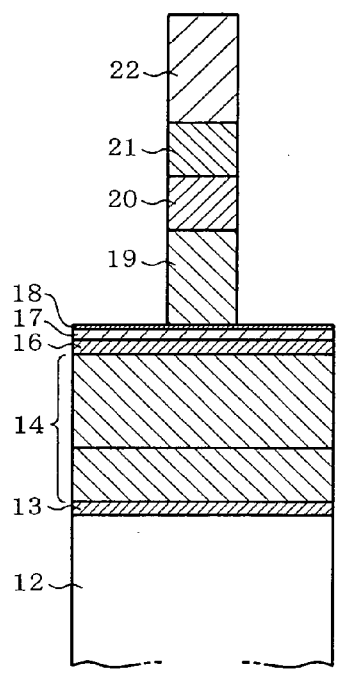

Subsequently, as shown in FIGS. 8A to 8C, the WSi film 20 is etched with the resist 22 and silicon nitride film 21 serving as a mask. Subsequently, as shown in FIGS. 9A to 9C, the third polycrystalline silicon layer 19 is etched with the patterned resist 22, silicon nitride film 21 and WSi film 20 serving as a mask so that the silicon oxide film 18 is exposed (a seventh step). In this case, a high selective etching condition is applied to the silicon oxide film 18.

More specifically, consider a case where both a dense pattern part (see FIG. 9B) whose aspect ratio is about 7 and a sparse pattern part (see FIG. 9C) whose aspect ratio is below 7 are simultaneously etched. In this case, the sparse pattern part is etched and the dense pattern is etched with the silicon oxide film 18 serving as an etch-stop so that the etching reaches a part just over the silicon oxide film 18. Accordingly, even when an etching speed in the dense pattern part differs from an etching speed in the sparse pattern part, upper surfaces of residues after the etching in the dense and sparse pattern parts can be rendered co-planar (a patterning step).

In other words, even if the recess 14c is formed while the second polycrystalline silicon film 17 constitutes a lower layer relative to the silicon oxide film 18, the flat silicon oxide film 18 functions as an etch-stop, whereupon the second polycrystalline silicon layer 17 buried in the recess 14c can be prevented from being etched. Consequently, adverse effects due to the microloading effect can be restrained or reduced.

Figure 10A:
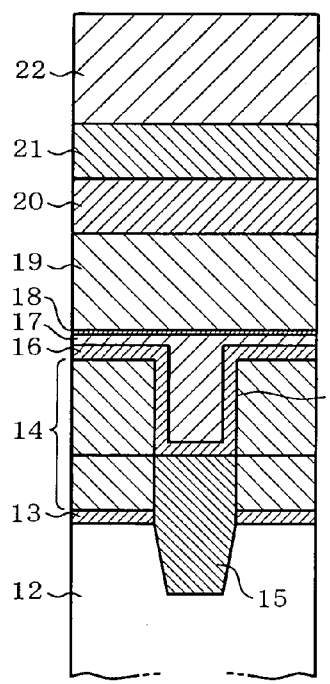
FIG. 10A is a sectional view of the major part of the semiconductor device as viewed from the front side (phase 8)
Figure 10B:
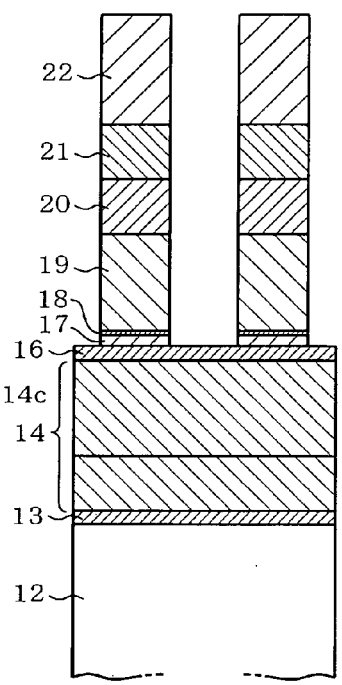
FIGS. 10B and 10C are longitudinal side sections of the dense and sparse pattern parts, showing the fabrication steps, respectively (phase 8)
Figure 10C:
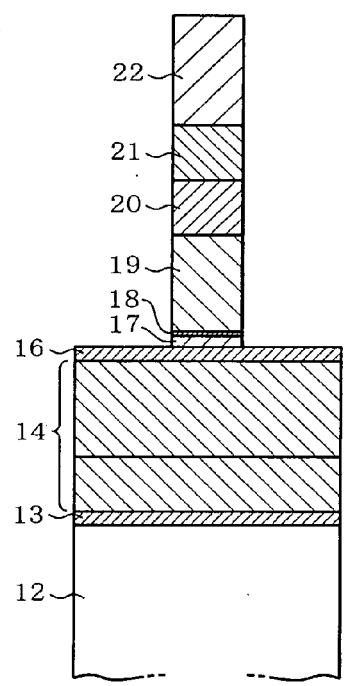
Figures 11A, 11B, 11C:
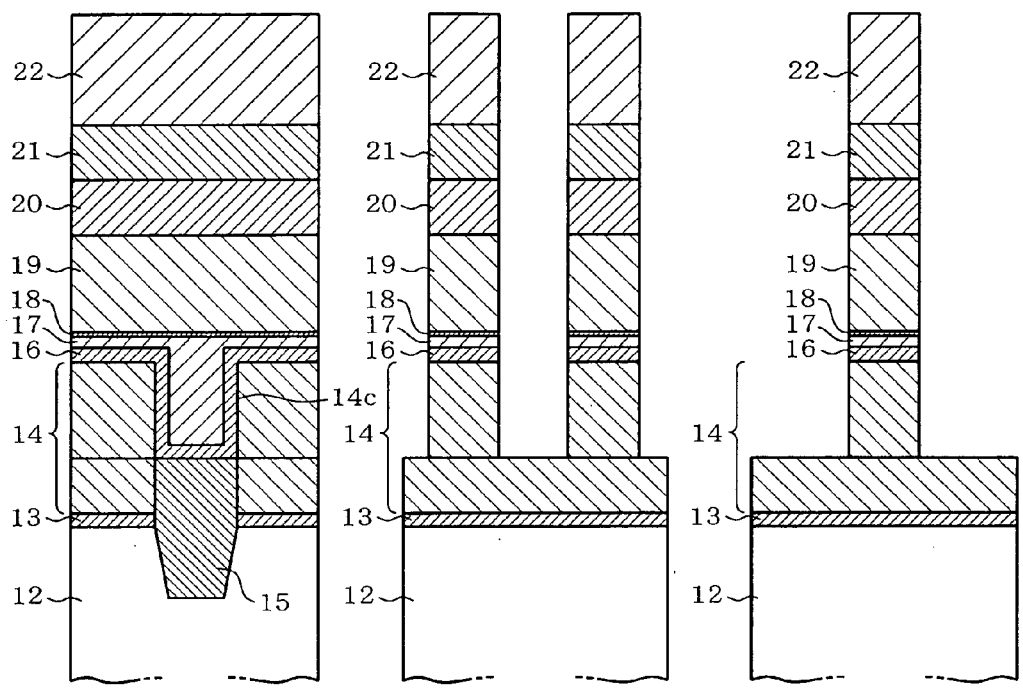
FIG. 11A is a sectional view of the major part of the semiconductor device as viewed from the front side (phase 9)
FIGS. 11B and 11C are longitudinal side sections of the dense and sparse pattern parts, showing the fabrication steps, respectively (phase 9)
Figures 12A, 12B, 12C:
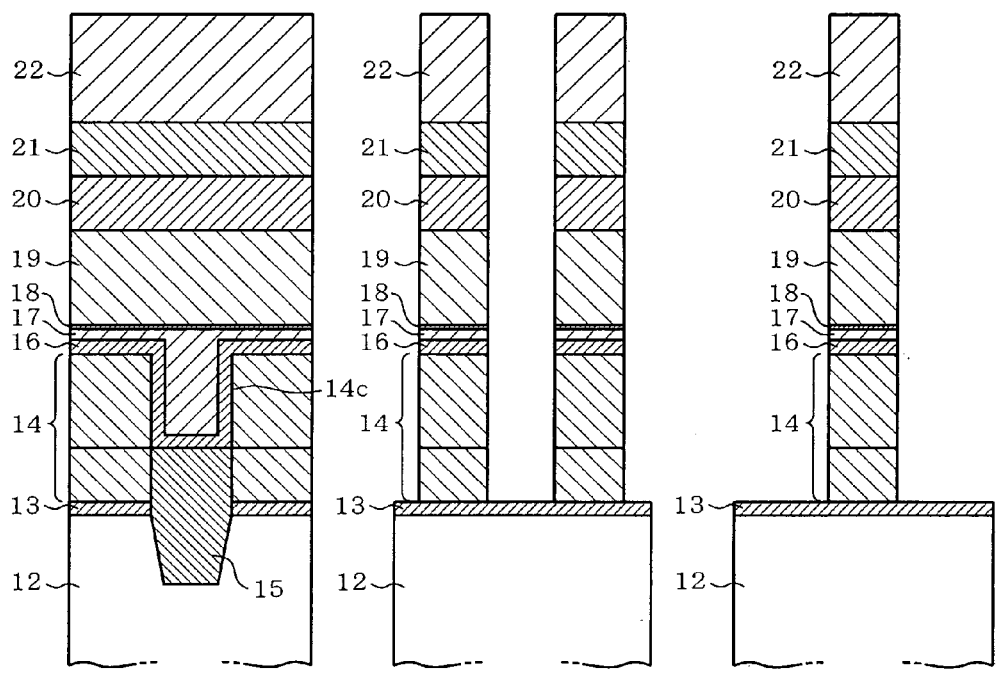
FIG. 12A is a sectional view of the major part of the semiconductor device as viewed from the front side (phase 10)
FIGS. 12B and 12C are longitudinal side sections of the dense and sparse pattern parts, showing the fabrication steps, respectively (phase 10)
Figure 13A:
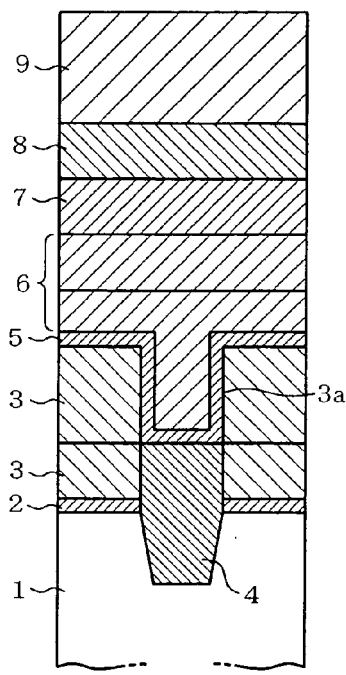
FIGS. 13A to 13C are views similar to FIGS. 9A to 9C, showing a prior art, respectively.
Figure 13B:
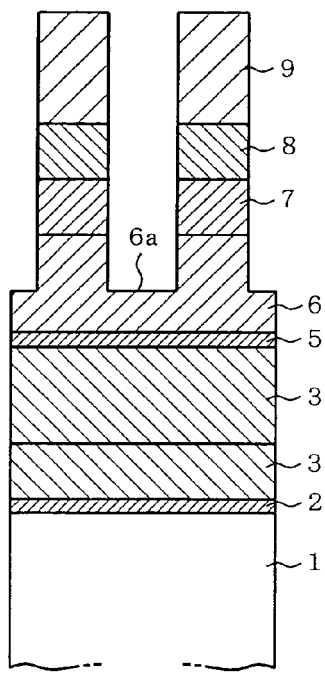
Figure 13C:
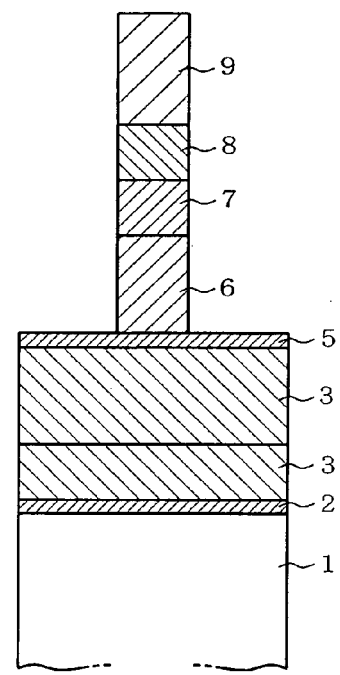
Figures 14A, 14B, 14C:
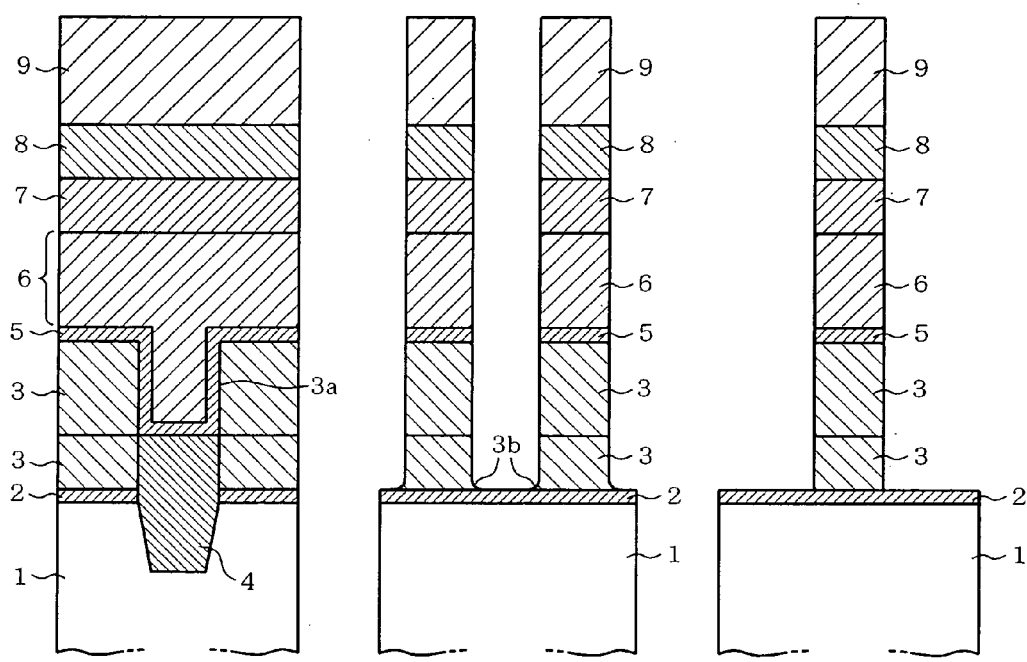
FIGS. 14A to 14C are views similar to FIGS. 12A to 12C, showing the prior art, respectively.

Subsequently, as shown in FIGS. 10A to 10C, the silicon oxide film 18 is etched with the resist 22 and silicon nitride film 21 serving as a mask under a low selective etching condition thereby to be eliminated (an eighth step). In this case, the second polycrystalline silicon layer 17 side located beneath the silicon oxide film 18 is also etched together with the silicon oxide film 18.

Subsequently, as shown in FIGS. 11A to 11C and 12A to 12C, the ONO film 16 and first polycrystalline silicon layer 14 are etched gate oxide film 13 is etched under a high selective etching condition so that the etching reaches a part just over the gate oxide film 13 (a ninth step). Accordingly, even when an etching speed in the dense pattern part differs from an etching speed in the sparse pattern part, the etching process is once stopped over the silicon oxide film 18 and subsequently, the etching is carried out so as to reach just over the gate oxide film 13. Consequently, the etching can reliably be carried out so as to reach just over the gate oxide film 13 both in the dense and sparse pattern parts and accordingly, adverse effects due to the microloading effect can be restrained or reduced under a high selective etching condition.

Subsequently, the non-volatile memory is fabricated further through a resist removal step, a wiring step and an inspection step. Since these steps have no relation with the characteristics of the embodiment, the description of these steps is eliminated.

In the above-described embodiment, the surface of the third polycrystalline silicon layer 17 buried in the recess 14c is heat-treated such that the third polycrystalline silicon layer 17 is oxidated so as to cover the ONO film 16, and the silicon oxide film 18 is formed so as to serve as the etch-stop insulating film. After the layers 19 to 21 have been stacked, etching is carried out until the silicon oxide film 18 is exposed. Subsequently, the silicon oxide film 18 is positively etched and then, etching is re-carried out so as to reach the part just over the surface of the gate oxide film 13. Accordingly, even if the etching speed differs in the dense and sparse pattern parts when the dense pattern part whose aspect ratio is about 7 and the sparse pattern part whose aspect ratio is less than 7 are simultaneously etched, etching is carried out so as to reach the same middle position (the silicon oxide film 18) in both dense and sparse pattern parts and thereafter, etching can be carried out so as to reach a part just over the surface of the gate oxide film 13. Consequently, the possibility of resulting in formation of a level difference or a skirt after the etching can be reduced and thus, the adverse effects due to the microloading effect can be restrained or reduced.

Modified Forms:

The invention should not be limited by the foregoing embodiment but may be modified or expanded as follows.

The invention may be applied to other memories such SRAM or other semiconductor devices such as microprocessors since these devices encounter the same problem according to a degree of integration.

The second insulating film 18 may be formed at any position between the surface of the gate oxide film 13 and the location where the silicon nitride film 21 is to be formed. Further, the second insulating film 18 may be made of any material which allows the second insulating film 18 to function as the etch stop and which differs from that of the first insulating film 16.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A semiconductor device, comprising:
    a semiconductor substrate including a memory cell region and a peripheral circuit region, wherein the memory cell region has a plurality of first element regions and an element isolation region isolating the first element regions from each other, and the peripheral circuit region has a second element region;
    a shallow trench isolation located in the element isolation region including a first lower portion embedded in the semiconductor substrate and a first upper portion projecting from a surface of the semiconductor substrate, the first upper portion including a pair of first side surfaces and a first upper surface;
    a first gate insulating film located on the semiconductor substrate in the first element regions;
    a second gate insulating film located on the semiconductor substrate in the second element region;
    a first floating gate electrode located on the first gate insulating film, including a second lower portion having a second side surface facing to one of the first side surfaces and a second upper portion located on the second lower portion, the second upper portion including a second upper surface and a third side surface flush with the second side surface;
    a second floating gate electrode located on the first gate insulating film, including a third lower portion having a fourth side surface facing to the other of the first side surfaces and a third upper portion located on the third lower portion, the third upper portion including a third upper surface and a fifth side surface flush with the fourth side surface;
    a first inter-gate insulating film located on the first upper surface of the shallow trench isolation, the second upper surface of the first floating gate electrode, the third upper surface of the second floating gate electrode, the third side surface of the first floating gate electrode and the fifth side surface of the second floating gate electrode;
    a control gate electrode located on the first inter-gate insulating film, including a fourth lower portion having a fourth upper surface, a fourth upper portion and a first etching stopper film located between the fourth lower and upper portions, the fourth lower portion being located above the first upper surface, the second upper surface and the third upper surface so that a space between the second and the third upper portions is buried with the fourth lower portion and so that the fourth upper surface of the fourth lower portion is flush throughout regions of the first floating gate electrode, the second floating gate electrode and the shallow trench isolation;
    a lower electrode located on the second gate insulating film, including a fifth upper surface having a height relative to a surface of the second gate insulating film, said height of the fifth upper surface being the same as a height of the second and third upper surfaces relative to a surface of the first gate insulating film;
    a second inter-gate insulating film located on the fifth upper surface of the lower electrode and having a thickness that is the same as a thickness of the first inter-gate insulating film; and
    an upper electrode located on the second inter-gate insulating film, including a fifth lower portion having a sixth upper surface, a fifth upper portion and a second etching stopper film located between the fifth lower and upper portions,
    wherein the sixth upper surface and the second etching stopper film have an interface therebetween, and the interface has a height relative to the surface of the second gate insulating film, said height being the same as a height of an interface between the fourth upper surface and the first etching stopper film relative to the surface of the first gate insulating film.

2. The semiconductor device according to claim 1, wherein each of the first and the second etching stopper films includes a silicon oxide film.

3. The semiconductor device according to claim 1, wherein each of the first and second inter-gate insulating films includes a pair of a silicon oxide films and a silicon nitride film located between the silicon oxide films.

4. The semiconductor device according to claim 1, wherein the third side surface of the first floating gate electrode is flush with one of the first side surfaces of the shallow trench isolation, and the fifth side surface of the second floating gate electrode is flush with the other of the first side surface of the shallow trench isolation.

5. The semiconductor device according to claim 1, wherein each of the second lower and upper portions of the first floating gate electrode, the third lower and upper portions of the second floating gate electrode, the fourth lower and upper portions of the control gate electrode, the lower electrode and the fifth lower and upper portions of the upper electrode includes a polycrystalline silicon film.

6. The semiconductor device according to claim 5, wherein each of the fourth upper portion of the control gate electrode and the fifth upper portion of the upper electrode includes a silicide layer.

7. The semiconductor device according to claim 6, wherein the silicide layer includes a tungsten silicide layer.

* * * * *